(12) United States Patent
Hunter et al.

(10) Patent No.: US 9,064,602 B2
(45) Date of Patent: Jun. 23, 2015

(54) IMPLEMENTING MEMORY DEVICE WITH SUB-BANK ARCHITECTURE

(71) Applicant: International Business Machines Corporation, Armonk, NY (US)

(72) Inventors: Hillery C. Hunter, Chappaqua, NY (US); Charles A. Kilmer, Essex Junction, VT (US); Kyu-hyoun Kim, Mount Kisco, NY (US); Warren E. Maule, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/060,665

(22) Filed: Oct. 23, 2013

(65) Prior Publication Data

US 2015/0109874 A1 Apr. 23, 2015

(51) Int. Cl.
*G11C 8/00* (2006.01)
*G11C 11/408* (2006.01)

(52) U.S. Cl.
CPC ................................. *G11C 11/408* (2013.01)

(58) Field of Classification Search
CPC .......... G11C 8/00; G11C 11/409; G11C 7/00; G11C 7/22; G11C 8/12; G11C 11/16; G11C 7/10

USPC ............... 365/230.03, 233.1, 189.04, 233.16, 365/189.16, 230.08
See application file for complete search history.

(56) References Cited

U.S. PATENT DOCUMENTS

| | | | |
|---|---|---|---|
| 5,212,780 | A | 5/1993 | Padgaonkar et al. |
| 5,854,770 | A | 12/1998 | Pascucci |
| 6,269,017 | B1 | 7/2001 | Lu et al. |
| 6,631,089 | B1 | 10/2003 | Ogura et al. |
| 8,107,315 | B2 | 1/2012 | Chen |
| 8,441,851 | B2 | 5/2013 | Murata |
| 2012/0069666 | A1 | 3/2012 | Fukuda |
| 2012/0069683 | A1 | 3/2012 | Kamata et al. |
| 2013/0223140 | A1* | 8/2013 | Sohn .............................. 365/158 |

* cited by examiner

*Primary Examiner* — Thong Q Le
(74) *Attorney, Agent, or Firm* — Joan Pennington

(57) ABSTRACT

A method, system and memory controller are provided for implementing memory devices with sub-bank architecture in a computer system. An array is divided into sub-blocks having odd bit lines and even bit lines. The sub-blocks are alternated with rows of sense amplifiers; wherein a particular row of sense amplifiers connects only to odd bit lines and a next row of sense amplifiers connects only to even bit lines. More than one word line for a sub-block is allowed to be active at the same time, where a first active word line will select memory cells connected to even bit lines and a second active word line will select memory cells connected to odd bit lines.

14 Claims, 17 Drawing Sheets

600

| Pin | ACT command | RD/WR command |
|-----|-------------|---------------|
| BA3 | BA3 | BA3 |
| BA2 | BA2 | BA2 |
| BA1 | BA1 | BA1 |
| BA0 | BA0 | BA0 |
| A17 | RA17 | BLA2 |
| A16 | RA16 | BLA1 |
| A15 | RA15 | BLA0 |
| A14 | RA14 | |
| A13 | RA13 | |
| A12 | RA12 | |
| A11 | RA11 | |
| A10 | RA10 | |
| A9  | RA9  | CA9 |
| A8  | RA8  | CA8 |
| A7  | RA7  | CA7 |
| A6  | RA6  | CA6 |
| A5  | RA5  | CA5 |
| A4  | RA4  | CA4 |
| A3  | RA3  | CA3 |
| A2  | RA2  | CA2 |
| A1  | RA1  | CA1 |
| A0  | RA0  | CA0 |

FIG. 6

IMPLEMENTING MEMORY DEVICE WITH SUB-BANK ARCHITECTURE

FIELD OF THE INVENTION

The present invention relates generally to the data processing field, and more particularly, relates to a method, system and memory controller for implementing memory devices with a sub-bank architecture.

DESCRIPTION OF THE RELATED ART

As computer system performance continues to increase the number of cores and threads per processor socket also increase, which requires more memory performance.

Memory performance could be improved by increasing the average bandwidth. Memory bandwidth is limited by several DRAM core parameters, while the bank cycle time is one of most critical factors. However, it is very difficult to shorten the bank cycle time because it is limited by RC time constant that cannot be decreased without significant area overhead. The other way to overcome this is to have a larger number of banks per chip, which is also difficult due to die size overhead.

A need exists for an effective mechanism for implementing memory devices with sub-bank architecture to improve performance in a computer system.

As used in the following description and claims, the terms controller or memory controller should be broadly understood to include a memory controller, a storage controller, an input/output (IO) adapter (IOA), and a storage interface.

SUMMARY OF THE INVENTION

Principal aspects of the present invention are to provide a method, system and memory controller for implementing memory devices with a sub-bank architecture in a computer system. Other important aspects of the present invention are to provide such method, system and memory controller substantially without negative effects and that overcome many of the disadvantages of prior art arrangements.

In brief, a method, system and memory controller for implementing memory devices with q sub-bank architecture in a computer system. An array is divided into sub-blocks having odd bit lines and even bit lines. The sub-blocks are alternated with rows of sense amplifiers; wherein a particular row of sense amplifiers connects only to odd bit lines and a next row of sense amplifiers connects only to even bit lines. More than one word line for a sub-block is allowed to be active at the same time, where a first active word line will select memory cells connected to even bit lines and a second active word line will select memory cells connected to odd bit lines.

In accordance with features of the invention, an addressing method or protocol is provided where read or write command carry a sub-block address.

In accordance with features of the invention, a row decoder or word line driver circuit enables activation of multiple word lines in one row decoder block.

In accordance with features of the invention, a controller converts an address into bank/block/row/column addresses.

BRIEF DESCRIPTION OF THE DRAWINGS

The present invention together with the above and other objects and advantages may best be understood from the following detailed description of the preferred embodiments of the invention illustrated in the drawings, wherein:

FIG. 6 illustrates an example addresses for the memory device having a sub-bank architecture in the computer system of FIG. 1 in accordance with the preferred embodiments;

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, system and memory controller are provided for implementing memory devices with a sub-bank architecture. The number of banks per chip is effectively increased by enabling use a single bank as multiple banks or sub-banks.

Figure 1:
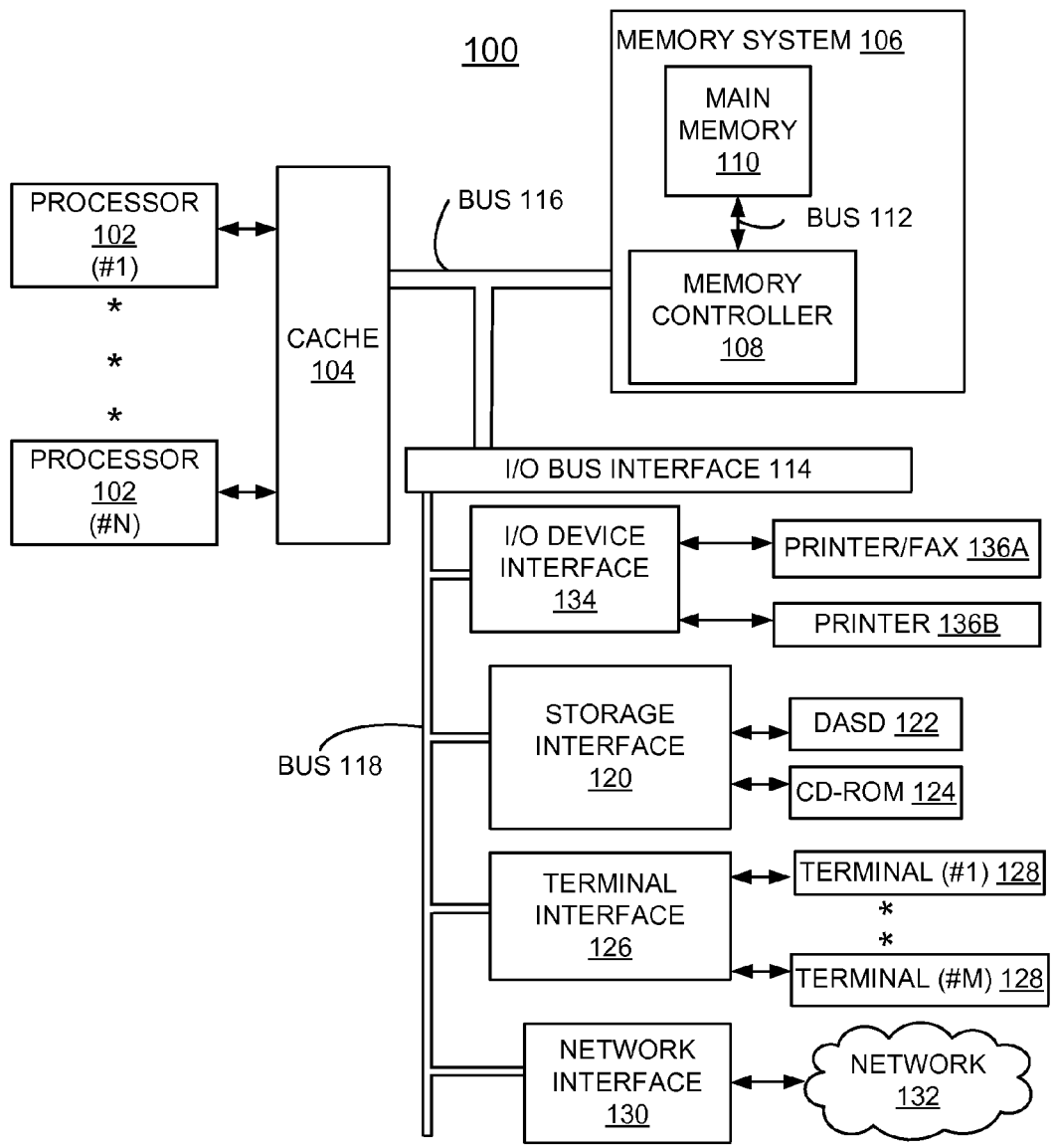
FIG. 1 is a block diagram of an example computer system embodying the present invention.

Having reference now to the drawings, in FIG. 1, there is shown a computer system embodying the present invention generally designated by the reference character 100 for implementing memory devices with a sub-bank architecture in accordance with the preferred embodiment. Computer system 100 includes one or more processors 102 or general-purpose programmable central processing units (CPUs) 102, #1-N. As shown, computer system 100 includes multiple processors 102 typical of a relatively large system; however, system 100 can include a single CPU 102. Computer system 100 includes a cache memory 104 connected to each processor 102.

Computer system 100 includes a memory system 106 including a memory controller 108 and a main memory 110 connected by a bus 112. Bus 112 is one or more busses that send address/command information to main memory 110 and send and receive data from the memory 110. Main memory 110 is a random-access semiconductor memory for storing data, including programs. Main memory 110 is comprised of, for example, a dynamic random access memory (DRAM), a synchronous direct random access memory (SDRAM), a current double data rate (DDRx) SDRAM, non-volatile memory, optical storage, and other storage devices.

I/O bus interface 114, and buses 116, 118 provide communication paths among the various system components. Bus 116 is a processor/memory bus, often referred to as front-side bus, providing a data communication path for transferring data among CPUs 102 and caches 104, memory controller 108 and I/O bus interface unit 114. I/O bus interface 114 is further coupled to system I/O bus 118 for transferring data to and from various I/O units.

As shown, computer system 100 includes a storage interface 120 coupled to storage devices, such as, a direct access storage device (DASD) 122, and a CD-ROM 124. Computer system 100 includes a terminal interface 126 coupled to a plurality of terminals 128, #1-M, a network interface 130 coupled to a network 132, such as the Internet, local area or other networks, and a I/O device interface 134 coupled to I/O devices, such as a first printer/fax 136A, and a second printer 136B.

I/O bus interface 114 communicates with multiple I/O interface units 120, 126, 130, 134, which are also known as I/O processors (IOPs) or I/O adapters (IOAs), through system I/O bus 116. System I/O bus 116 is, for example, an industry standard PCI bus, or other appropriate bus technology.

In accordance with features of the invention, memory devices with a sub-bank architecture in accordance with the preferred embodiments advantageously are used for a selected one of or both the main memory 110, and processor cache 104.

Computer system 100 is shown in simplified form sufficient for understanding the present invention. The illustrated computer system 100 is not intended to imply architectural or functional limitations. The present invention can be used with various hardware, software and firmware implementations and systems, various other internal software and firmware, and other internal hardware devices.

Figure 2A:
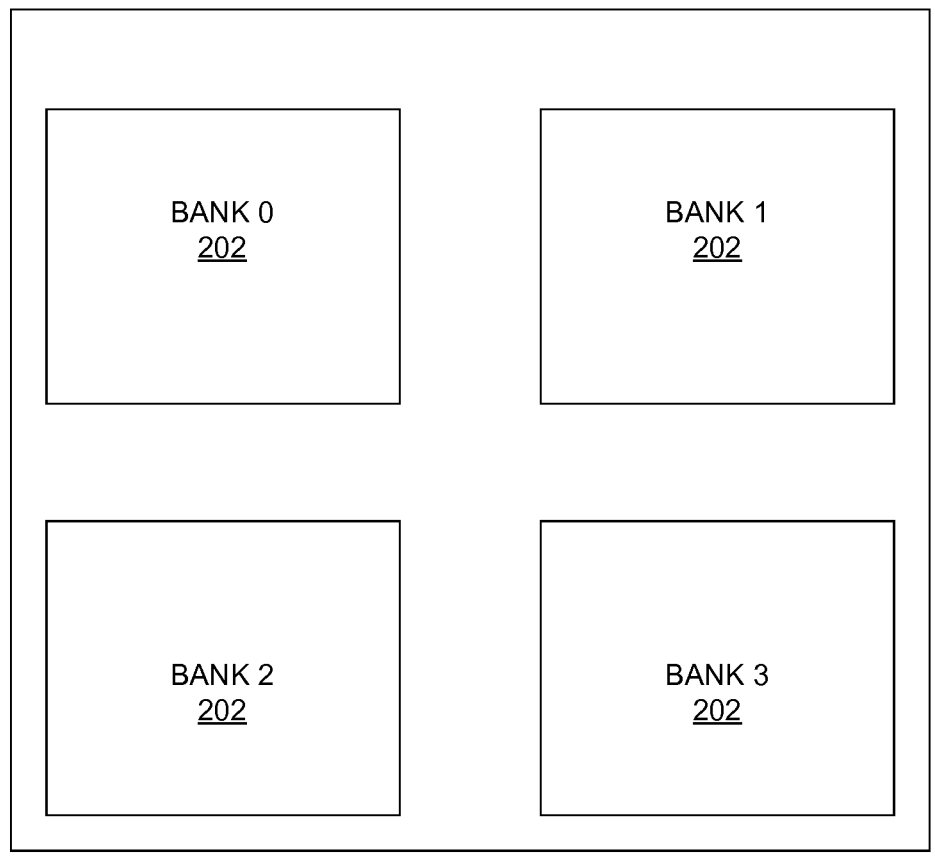
FIGS. 2A, 2B, and 2C together provide an example memory device in the computer system of FIG. 1 in accordance with the preferred embodiments.
Figure 2B:
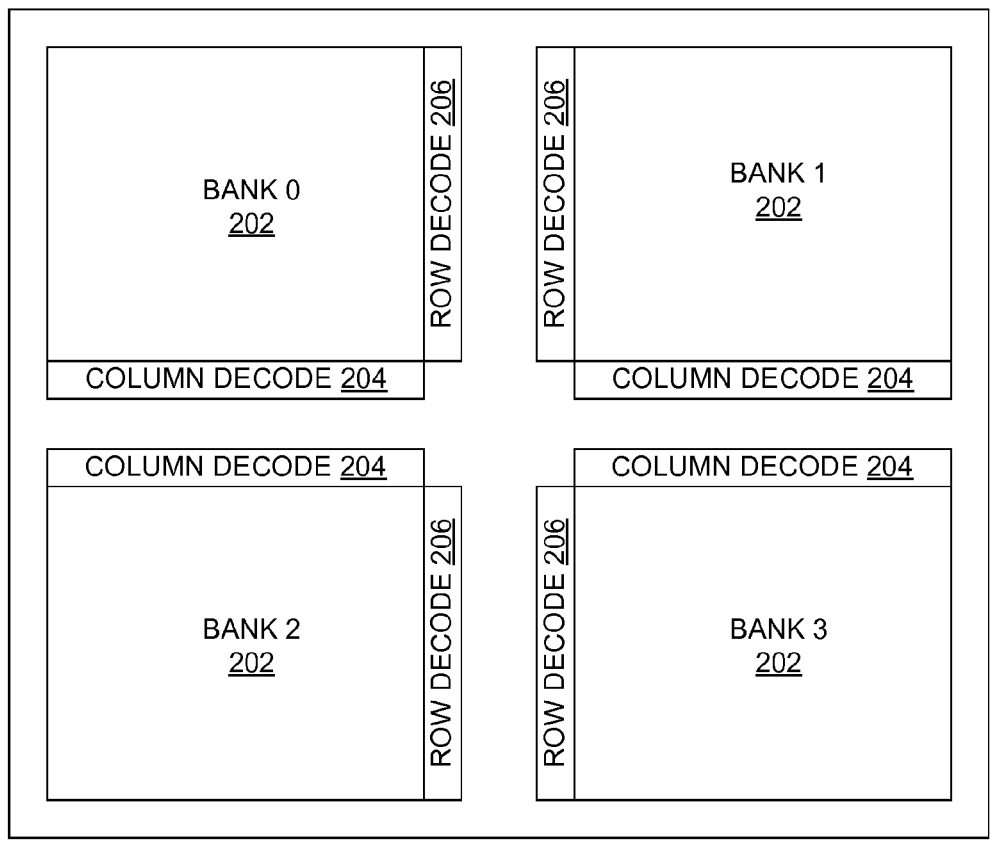
Figure 2C:
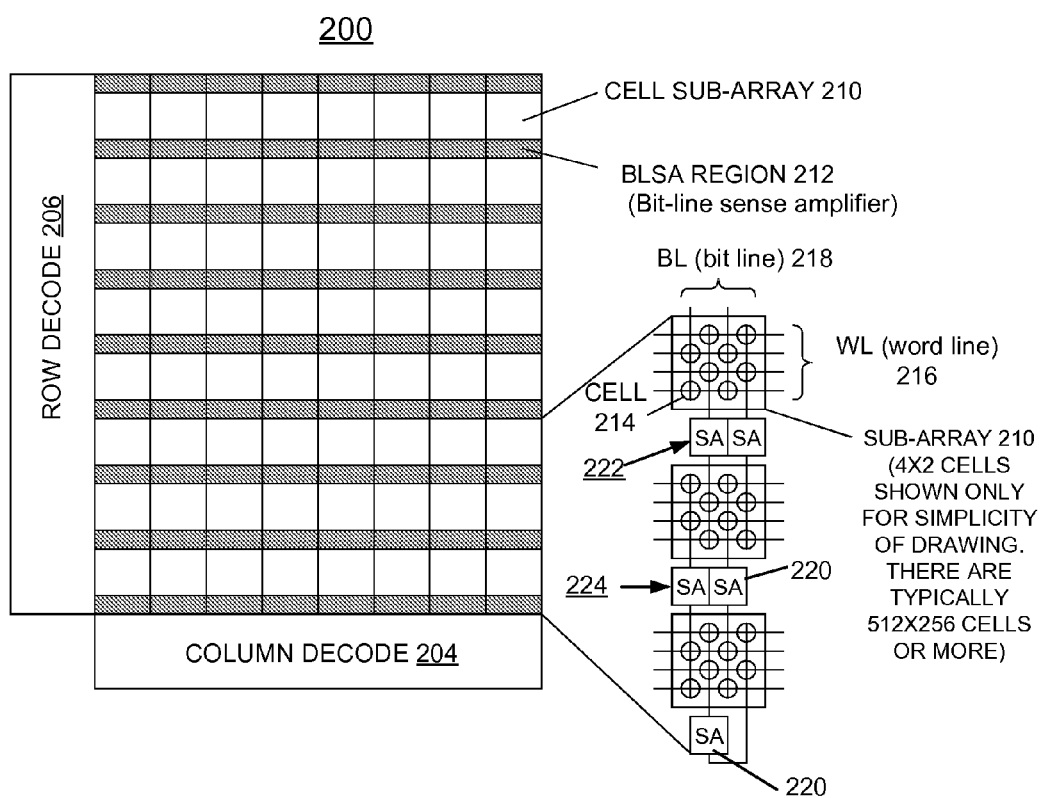

Referring to FIGS. 2A, 2B, and 2C, there is shown an example memory device generally designated by the reference character 200 in accordance with the preferred embodiments.

In FIG. 2A, the memory device 200 advantageously embodying memory devices with a sub-bank architecture in accordance with the preferred embodiments includes a plurality of memory banks 0-3, 202. A memory device 200, for example, a dynamic random access memory (DRAM), is usually composed of several banks. The memory banks 0-3, 202 are storage resources or cell arrays that can be accessed independently of each other, and looking like several chips inside a single chip. This increases performance.

As shown in FIG. 2B, each of the plurality of memory banks 0-3, 202 of the memory device 200 includes a respective column decode 204 and a row decode 206, costing more area with an increased number of banks.

In FIG. 2C, each of the plurality of memory banks 0-3, 202 (one shown) of the memory device 200 includes a plurality of cell sub-array 210 located between adjacent bit-line sense amplifier (BLSA) regions or BLSA rows 212. FIG. 2C includes a detail view of the cell sub-array 302 including a plurality of cells 214 with a respective BL (bit line) 216 and WL (word line) 218.

In accordance with features of the invention, cell sub-array or sub-blocks 210 are alternated with rows of sense amplifiers 220. The alternated rows 222, 224 of sense amplifiers 220 include a particular row 222 of sense amplifiers 110 that connects only to odd bit lines and a next row 224 of sense amplifiers 220 that connects only to even bit lines.

Figure 3:
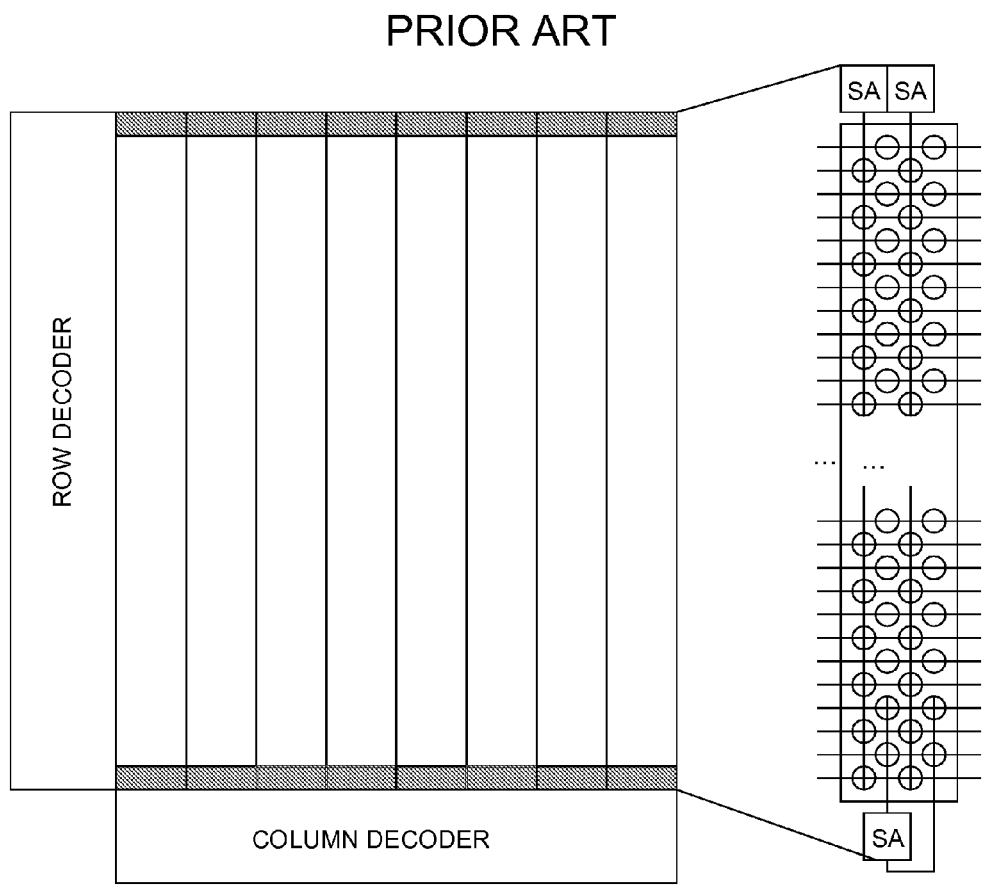
FIG. 3 illustrates a problem of an example memory bank including only a pair of sense amplifier (SA) rows with each bit line having so many junction loadings sensing would be extremely slow.

FIG. 3 illustrates a problem of an example memory bank including a only pair of sense amplifier (SA) rows so that with each bit line having so many junction loadings sensing would be extremely slow. As a result, the illustrated example memory bank would not be implemented in actual memory banks, which are composed of many SA rows.

Referring to FIGS. 4A, 4B, 4C, 4D, and 4E, which together provide example prior art operations of a memory device.

Figure 4A:
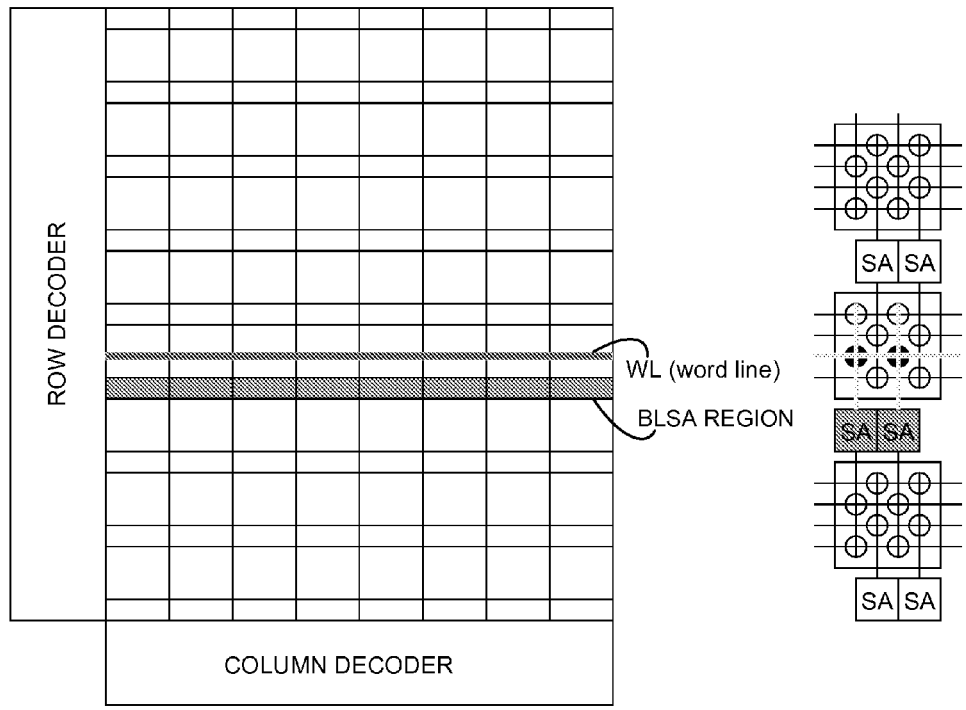
FIGS. 4A, 4B, 4C, 4D, and 4E together provide an example prior art operations of a memory device.
Figure 4B:
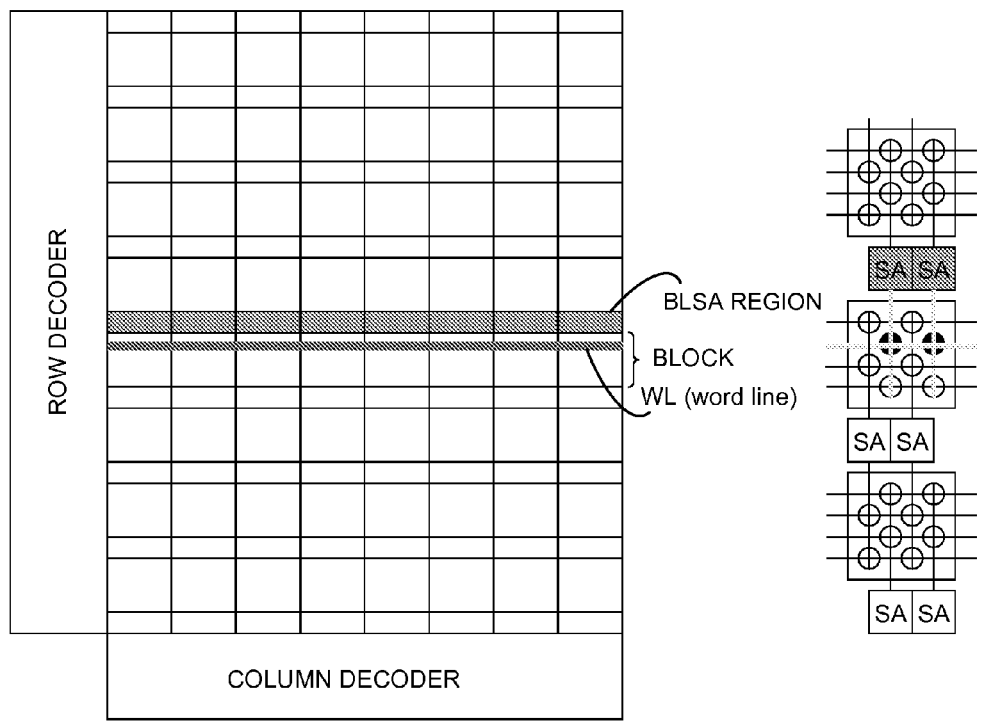

In FIG. 4A, one word line is activated a sense amplifier in a bit-line sense amplifier (BLSA) region at the bottom of the cell block including the activated word line is used. In FIG. 4B, one word line is activated, a sense amplifier in the bit-line sense amplifier (BLSA) region at the top of the cell block including the activated word line is used.

Figure 4C:
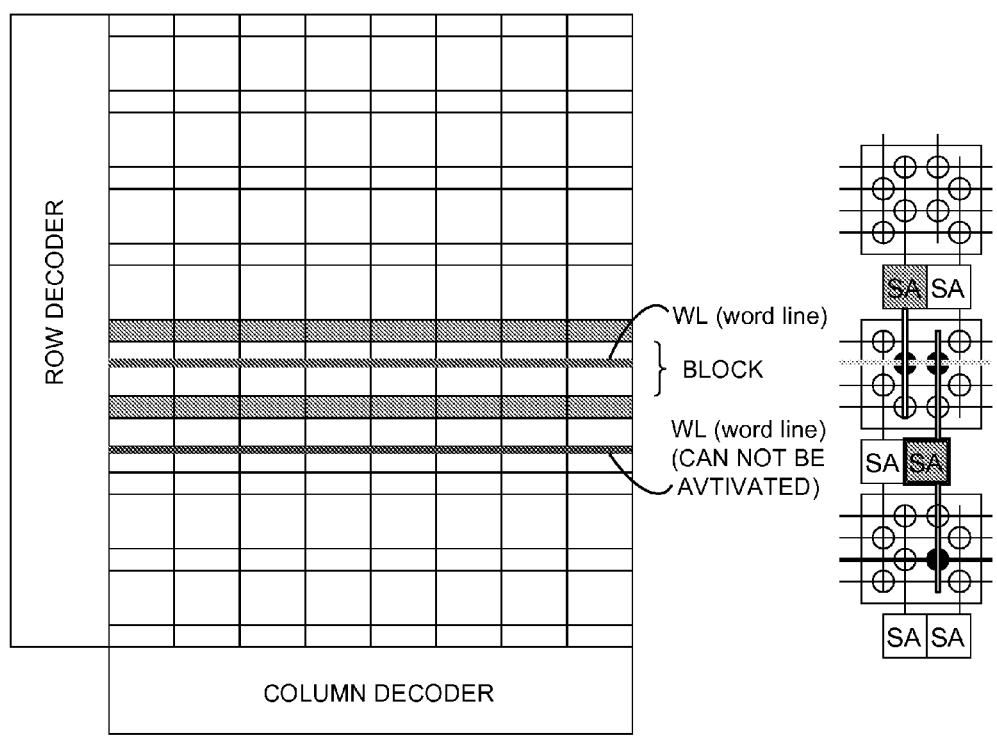

In FIG. 4C, one word line is activated, a sense amplifier in the bit-line sense amplifier (BLSA) region at the top and the bottom of the cell block including the activated word line are used. As shown, the word line in the adjacent block can not be activated, since the sense amplifier can sense only one cell at a time.

Figure 4D:
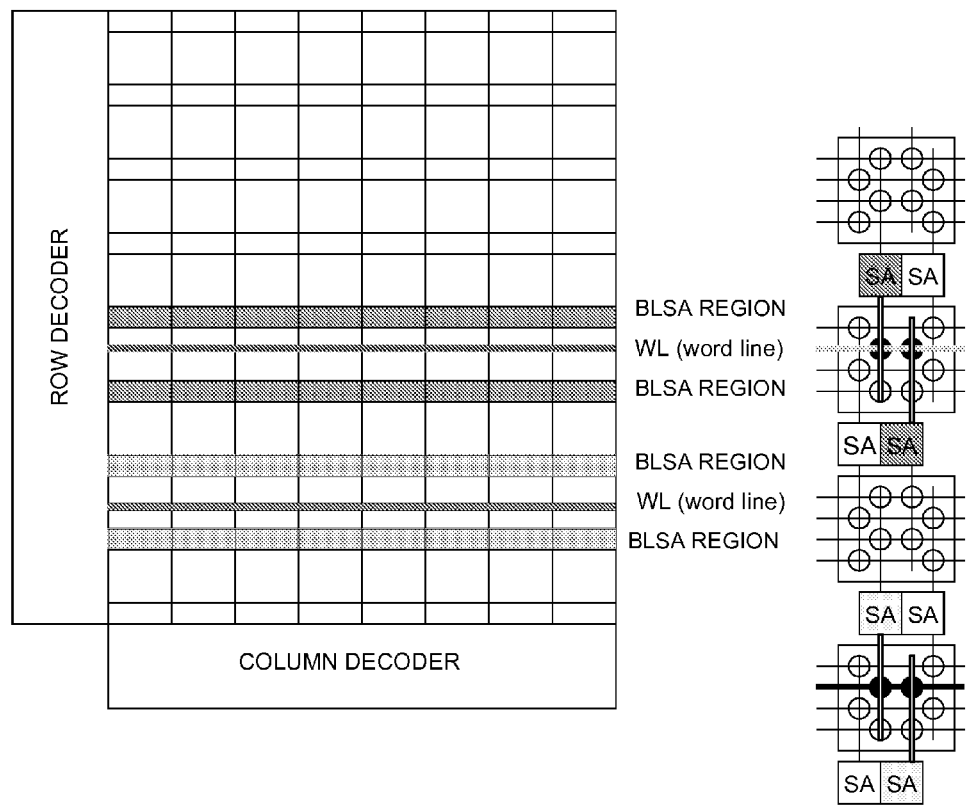

In FIG. 4D, two word lines are activated, a sense amplifier in the bit-line sense amplifier (BLSA) region at the top and the bottom of the respective cell blocks including the activated word line are used. As shown, the word line in each adjacent block is not be activated, the three activated word lines are within blocks that are spaced-apart by at least one cell block.

Figure 4E:
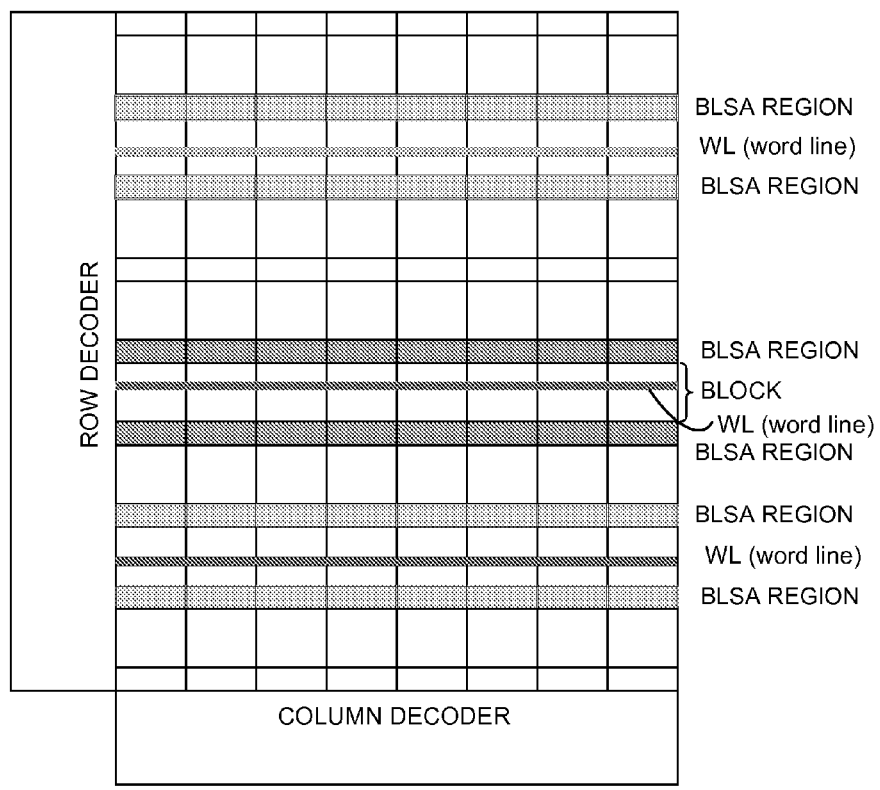

In FIG. 4E, three word lines are activated, a sense amplifier in the bit-line sense amplifier (BLSA) region at the top and the bottom of the respective cell blocks including the activated word line are used. As shown, the word line in the adjacent block is not activated; the two activated word lines are within blocks that are spaced-apart by a cell block. Any word line can be also activated as long as the block is not adjacent to any of the blocks with word lines already activated. This way, for example, more than one WL (maximum=# blocks/2) can be activated within a bank.

Figure 5:
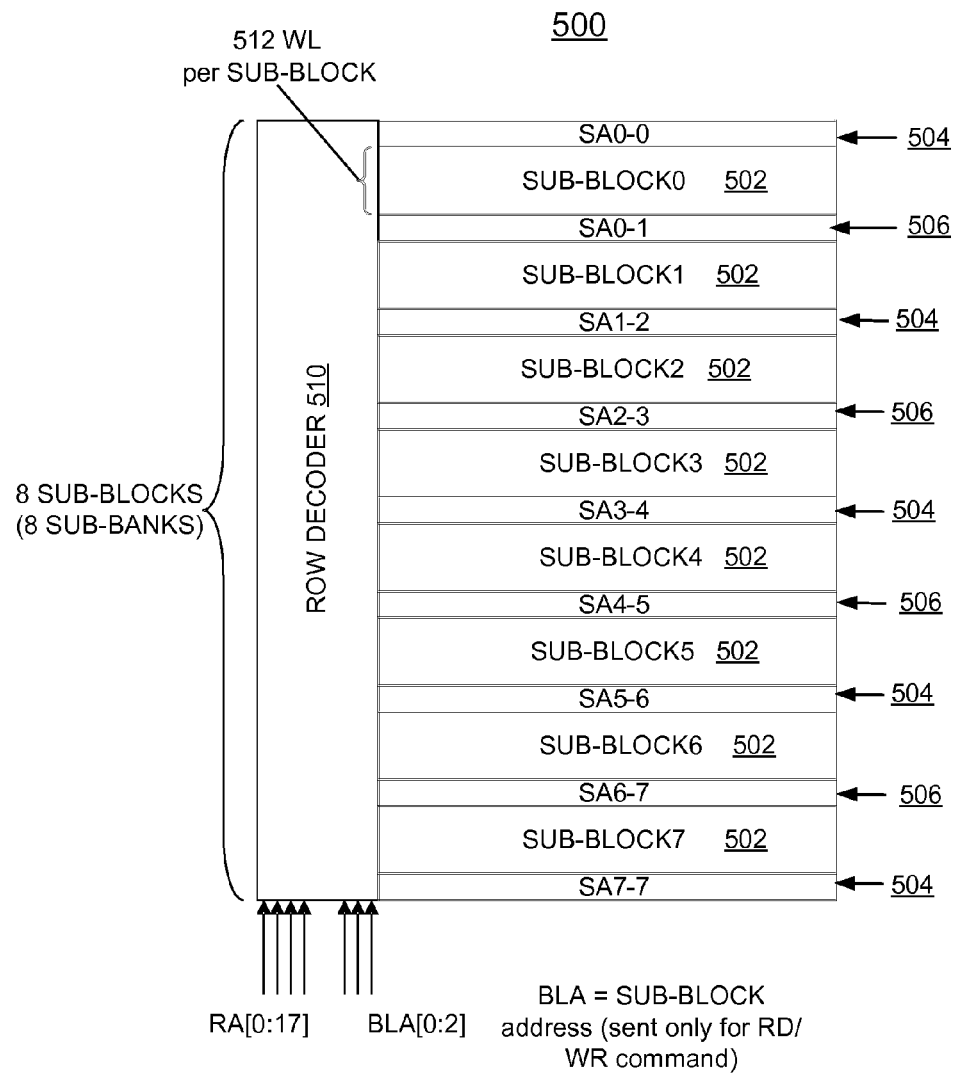
FIG. 5 illustrates an example memory device having a sub-bank architecture in the computer system of FIG. 1 in accordance with the preferred embodiments.

Referring to FIG. 5, there is shown an example memory device having a sub-bank architecture generally designated by the reference character 500 in accordance with the preferred embodiments. Memory device 500 includes a plurality of sub-banks or sub-blocks 0-7, 502, as shown, each including, for example 512 WL per sub-block. Each of the sub-blocks 0-7, 502 having odd and even bit lines, are alternated with rows of sense amplifiers 504, 506; where for example, a particular row of sense amplifiers 504 connects only to even bit lines and a next row of sense amplifiers 506 connects only to odd bit lines. Memory device 500 includes a row decoder 520 for the 8 sub-blocks 502 receiving address RA[0:17] and BLA[0:2], where BLA represent sub-block address, which is sent only for a RD/WR command.

Referring to FIG. 6, there are shown example addresses for the memory device having a sub-bank architecture generally designated by the reference character 600 in accordance with the preferred embodiments. Memory device addresses 600 include a pin 602, ACT (Row Activation command) 604 and RD/WR command 606.

Figure 7:
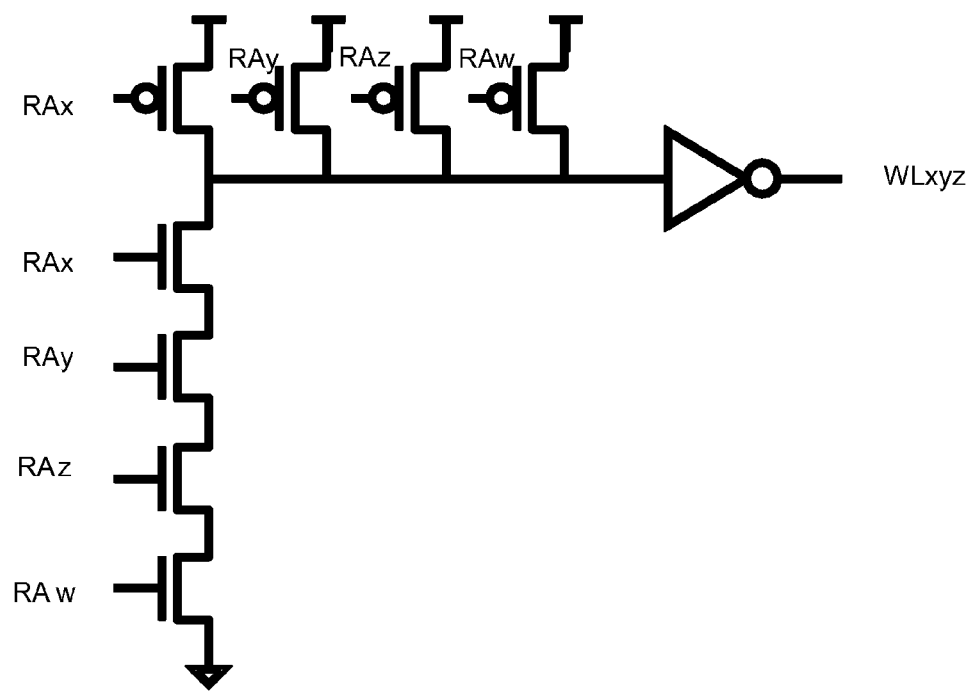
FIG. 7 illustrates an example prior art word line driver circuit.

FIG. 7 illustrates an example prior art or conventional word line driver circuit. The prior art word line driver includes a word buffer producing a word line driver output WLxyz. The prior art word line driver includes a stack of a first P-channel field effect transistor (PFET) and a plurality of N-channel field effect transistors (NFETs) connected between a supply voltage and ground, respectively receiving respective gate inputs of RAx, RAx, RAy, RAz, RAw and a plurality of pull-up P-channel field effect transistors (PFETs) connected between the supply voltage and the word buffer receive respective gate inputs of RAx, RAy, RAz, RAw.

Figure 8:
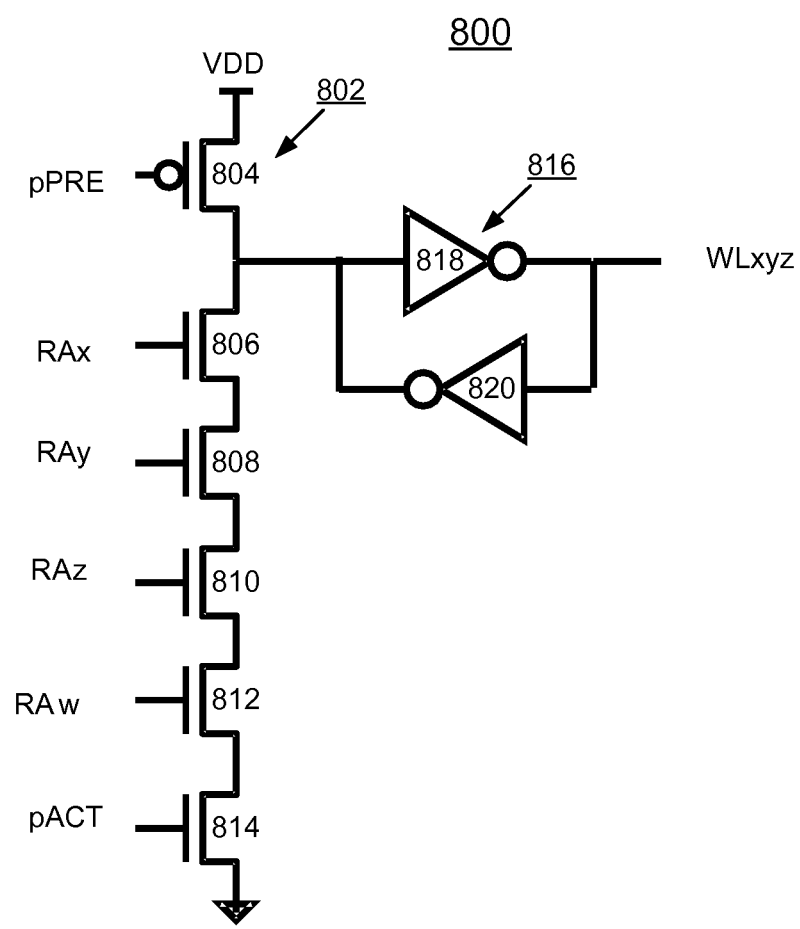
FIG. 8 illustrates an example word line driver circuit for the memory device having a sub-bank architecture in the computer system of FIG. 1 in accordance with the preferred embodiments.

Referring to FIG. 8, there is shown an example word line driver circuit generally designated by the reference character 800 in accordance with the preferred embodiments for the memory device having a sub-bank architecture, such as memory device 500. The word line driver circuit includes a transistor stack 802 of a first P-channel field effect transistor (PFET) 804 and a plurality of N-channel field effect transistors (NFETs) 806, 808, 810, 812, and 814 connected between a supply voltage and ground, respectively receiving respective gate inputs of pPRE, RAx, RAy, RAz, RAw, and Pact. A word line driver output WLxyz is provided by a driver hold state 816 defined by cross-coupled inverters 818, 820 connected to the transistor stack 802 at a series connection between PFET 804 and NFET 806.

Figure 9:
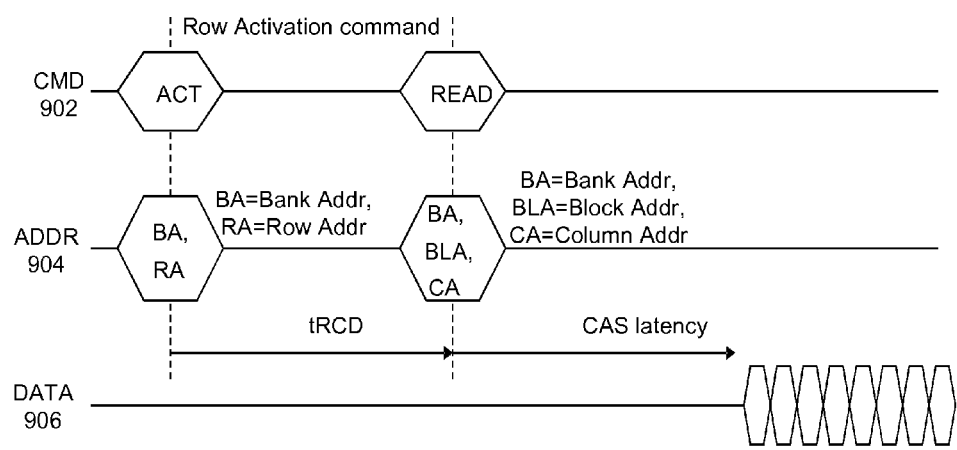
FIG. 9 illustrates an example command, address, data timing chart for the memory device having a sub-bank architecture in the computer system of FIG. 1 in accordance with the preferred embodiments.

Referring to FIG. 9, there is shown an example command, address, and data timing chart generally designated by the reference character 900 in accordance with the preferred embodiments for the memory device having a sub-bank, such as memory device 500. An illustrated CMD 902 includes commands ACT and READ following a time delay tRCD; addresses ADDR 904 include BA, RA (bank Addr, row Addr for the command ACT, and further include BA, BLA, CA (bank Addr, block Addr, column Addr) for the command READ, and data 906 following a time delay CAS latency after the command READ.

Figure 10:
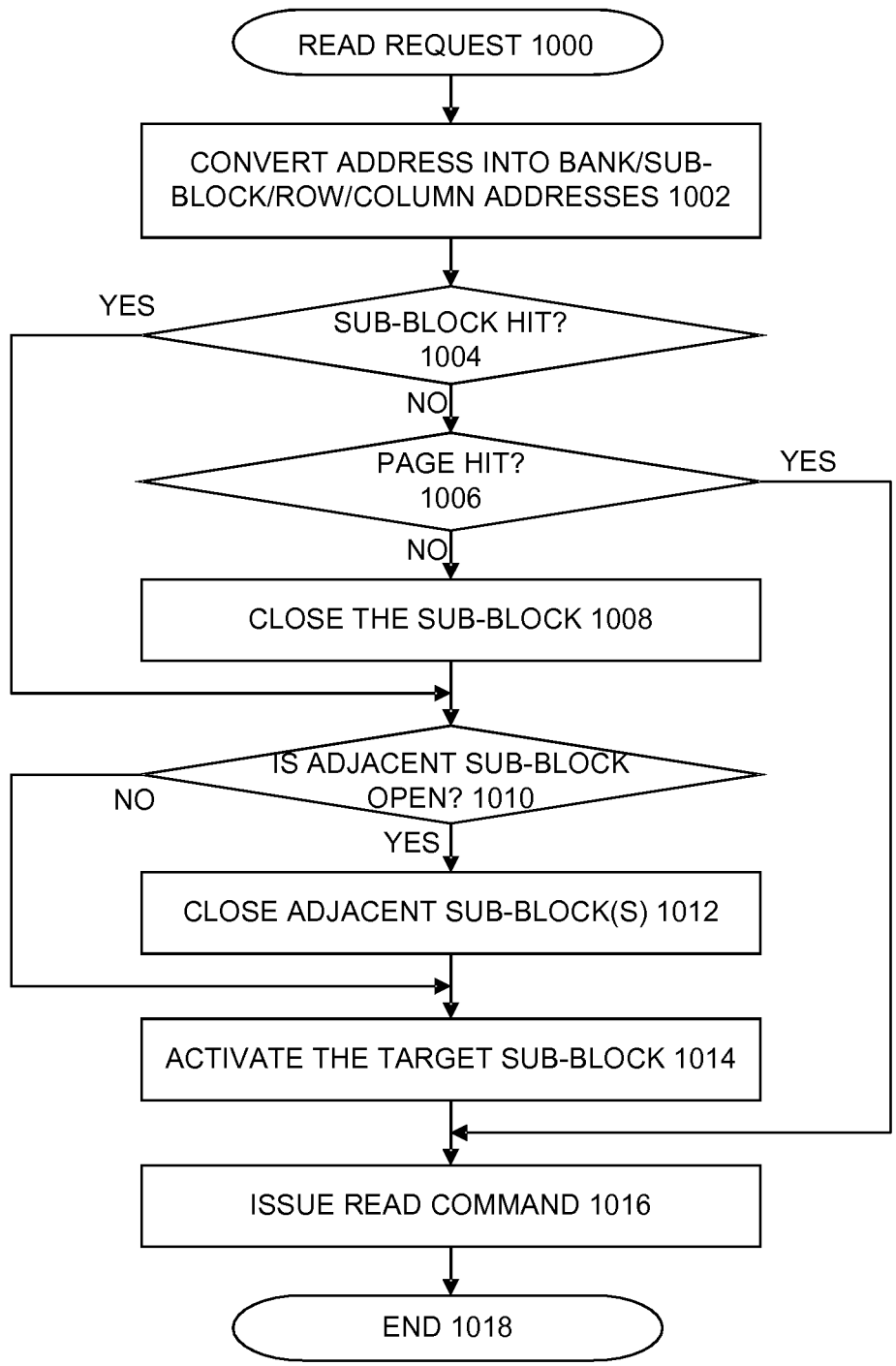
FIG. 10 is a flow chart illustrating example operations of a memory controller for implementing memory devices with a sub-bank architecture, such as in the computer system of FIG. 1 in accordance with the preferred embodiments.

Referring to FIG. 10, there are shown example operations of a memory controller for implementing memory devices with a sub-bank architecture, the memory device having a sub-bank architecture, such as memory device 500 in accordance with the preferred embodiments. First as indicated in a block 1000, a read request is received. The memory controller converts the address of the received read request into bank/sub-block/row/column addresses as indicated in a block 1002. The read or write command includes the added sub-block address in accordance with the preferred embodiments.

As indicated in a decision block 1004, checking for a sub-block hit is performed. When not a sub-block hit, checking for a page hit is performed as indicated in a decision block 1006. When not a page hit, then the sub-block is closed as indicated in a block 1008. With a sub-block hit at decision block 1004, then checking if the adjacent sub-block is open is performed as indicated in a decision block 1010. When the adjacent sub-block is open, then the adjacent sub-block or sub-blocks are closed as indicated in a block 1012. When the adjacent block is not open, then the target sub-block is activated as indicated in a block 1014. The read command is issued as indicated in a block 1016. The operations end as indicated in a block 1018.

Figure 11:
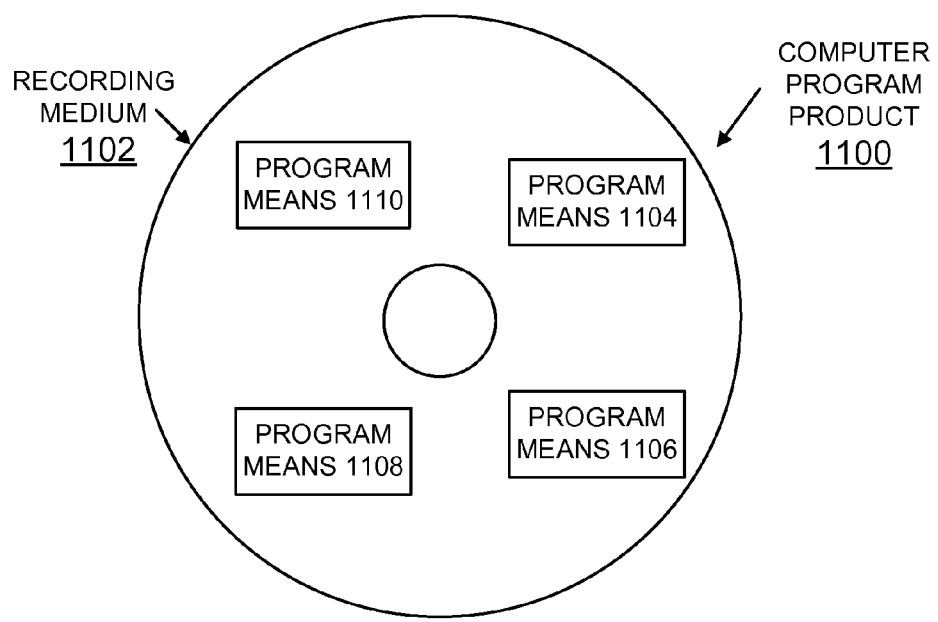
FIG. 11 is a block diagram illustrating a computer program product in accordance with the preferred embodiment.

Referring now to FIG. 11, an article of manufacture or a computer program product 1100 of the invention is illustrated. The computer program product 1100 is tangibly embodied on a non-transitory computer readable storage medium that includes a recording medium 1102, such as, a floppy disk, a high capacity read only memory in the form of an optically read compact disk or CD-ROM, a tape, or another similar computer program product. Recording medium 1102 stores program means 1104, 1106, 1108, and 1110 on the medium 1102 for carrying out the methods for implementing memory devices with a sub-bank architecture in accordance with the preferred embodiments in the system 100 of FIG. 1.

A sequence of program instructions or a logical assembly of one or more interrelated modules defined by the recorded program means 1104, 1106, 1108, and 1110, direct the computer system 100, for implementing memory devices with a sub-bank architecture in accordance with the preferred embodiments.

While the present invention has been described with reference to the details of the embodiments of the invention shown in the drawing, these details are not intended to limit the scope of the invention as claimed in the appended claims.

What is claimed is:

1. A method for implementing memory devices with sub-bank architecture in a computer system comprising:
   dividing a memory cell array into a plurality of cell sub-blocks located between adjacent bit-line sense amplifier (BLSA) regions and having odd bit lines and even bit lines;
   alternating the plurality of cell sub-blocks with rows of sense amplifiers disposed in respective adjacent bit-line sense amplifier (BLSA) regions; wherein a particular row of sense amplifiers connects only to odd bit lines and a next row of sense amplifiers connects only to even bit lines;
   providing a row decoder receiving a sub-block address including bank/block/row/column addresses sent only for a RD/WR command for enabling more than one word line for a respective sub-block of the plurality of cell sub-blocks to be active at the same time, with a first active word line selecting memory cells connected to even bit lines and a second active word line selecting memory cells connected to odd bit lines.

2. The method as recited in claim 1 wherein enabling more than one word line to be active at the same time includes providing an addressing protocol where a read command and a write command include said sub-block address.

3. The method as recited in claim 1 wherein enabling more than one word line to be active at the same time includes providing a controller for converting an address for a read command or a write command into said bank/block/row/column addresses.

4. The method as recited in claim 1 wherein enabling more than one word line to be active at the same time includes providing a word line driver circuit enabling activation of multiple word lines in one row decoder block.

5. The method as recited in claim 1 wherein enabling more than one word line to be active at the same time includes providing a word line driver circuit including a transistor stack of a first P-channel field effect transistor (PFET) and a plurality of N-channel field effect transistors (NFETs) connected between a supply voltage and ground, respectively receiving respective gate inputs and a word line driver output provided by a driver hold state defined by cross-coupled inverters connected to the transistor stack at a series connection between the first PFET and NFET.

6. A system comprising:
   a memory controller for implementing memory devices with sub-bank architecture in the computer system,
   a processor;
   a memory device coupled to said memory controller and said processor; said memory device including an array being divided into a plurality of cell sub-blocks located between adjacent bit-line sense amplifier (BLSA) regions and having odd bit lines and even bit lines; said plurality of cell sub-blocks with rows of sense amplifiers disposed in respective adjacent bit-line sense amplifier (BLSA) regions; wherein a particular row of sense amplifiers connects only to odd bit lines and a next row of sense amplifiers connects only to even bit lines;

said memory controller coupled to a row decoder receiving a sub-block address including bank/block/row/column addresses sent only for a RD/WR command;

said memory controller enabling more than one word line for a respective cell sub-block of the plurality of cell sub-blocks to be active at the same time, with a first active word line selecting memory cells connected to even bit lines and a second active word line selecting memory cells connected to odd bit lines.

7. The system as recited in claim 6 includes program code stored on a non-transitory computer readable storage medium, and wherein said memory controller uses said program code for enabling more than one word line for a sub-block to be active at the same time.

8. The system as recited in claim 6 wherein said memory controller implementing an addressing protocol where a read command and a write command include said sub-block address.

9. The system as recited in claim 6 wherein said memory controller receives an address for a read command and a write command, said memory controller converts said received address to include said sub-block address.

10. The system as recited in claim 6 wherein said memory device includes a Dynamic Random Access Memory (DRAM).

11. The system as recited in claim 6 wherein said array of memory device includes said row decoder and a column decoder.

12. The system as recited in claim 6 wherein said array of memory device includes said row decoder, said row decoder enables activation of multiple word lines in one said sub-block.

13. The system as recited in claim 6 wherein said array of memory device includes a word line driver circuit enabling activation of multiple word lines in one said sub-block.

14. The system as recited in claim 6 wherein said memory controller receives an address for a read command or a write command, said memory controller converts said received address to include said sub-block address, said memory controller closes an adjacent open sub-block, activates a target sub-block responsive to closing said adjacent open sub-block and issues the read command or write command.

* * * * *